(12) United States Patent
Suzuki et al.

(10) Patent No.: US 10,263,102 B2
(45) Date of Patent: Apr. 16, 2019

(54) SEMICONDUCTOR DEVICE AND METHOD OF MANUFACTURING THE SAME

(71) Applicant: Mitsubishi Electric Corporation, Tokyo (JP)

(72) Inventors: Kenji Suzuki, Tokyo (JP); Mitsuru Kaneda, Tokyo (JP); Koichi Nishi, Tokyo (JP); Katsumi Nakamura, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/898,375

(22) Filed: Feb. 16, 2018

(65) Prior Publication Data

US 2018/0366566 A1 Dec. 20, 2018

(30) Foreign Application Priority Data

Jun. 20, 2017 (JP) ................................ 2017-120399

(51) Int. Cl.
*H01L 29/739* (2006.01)
*H01L 29/10* (2006.01)
*H01L 29/08* (2006.01)
*H01L 29/861* (2006.01)
*H01L 29/66* (2006.01)

(52) U.S. Cl.
CPC ...... *H01L 29/7397* (2013.01); *H01L 29/0804* (2013.01); *H01L 29/0821* (2013.01); *H01L 29/0834* (2013.01); *H01L 29/1004* (2013.01); *H01L 29/1095* (2013.01); *H01L 29/66348* (2013.01); *H01L 29/861* (2013.01)

(58) Field of Classification Search
CPC .......... H01L 29/7397; H01L 29/66348; H01L 29/0821; H01L 29/0804; H01L 29/1004; H01L 29/0834; H01L 29/1095; H01L 29/861

See application file for complete search history.

(56) References Cited

U.S. PATENT DOCUMENTS

| 2009/0184338 A1 | 7/2009 | Hisamoto |
| 2011/0133246 A1 | 6/2011 | Ueno |

(Continued)

FOREIGN PATENT DOCUMENTS

| JP | 2009-176882 A | 8/2009 |
| JP | 2011-119542 A | 6/2011 |

(Continued)

*Primary Examiner* — Yosef Gebreyesus
(74) *Attorney, Agent, or Firm* — Studebaker & Brackett PC

(57) ABSTRACT

An object of the present invention is to provide a semiconductor device capable of preventing an occurrence of oscillation of voltage and current and a method of manufacturing the same. A semiconductor device according to the present invention includes an n type silicon substrate and a first n type buffer layer formed in a back surface of the n type silicon substrate and having a plurality of peaks of concentration of protons whose depths from the back surface are different from each other. In the first n type buffer layer, a concentration gradient of the protons from the peak located in a position closer to the back surface toward the surface of the n type silicon substrate is smaller than a concentration gradient of the protons from the peak located in a position farther away from the back surface toward the surface.

24 Claims, 13 Drawing Sheets

(56) References Cited

U.S. PATENT DOCUMENTS

| | | | |
|---|---|---|---|
| 2014/0070268 A1* | 3/2014 | Yoshimura | H01L 29/0834 257/139 |
| 2014/0217407 A1* | 8/2014 | Mizushima | H01L 29/32 257/48 |
| 2014/0246750 A1* | 9/2014 | Takishita | H01L 21/263 257/493 |
| 2014/0299915 A1 | 10/2014 | Kouno et al. | |
| 2018/0019131 A1 | 1/2018 | Suzuki et al. | |

FOREIGN PATENT DOCUMENTS

| | | |
|---|---|---|
| JP | 2013-138172 A | 7/2013 |
| JP | 2014-039057 A | 2/2014 |
| WO | 2016/147264 A1 | 9/2016 |

* cited by examiner

F I G . 3
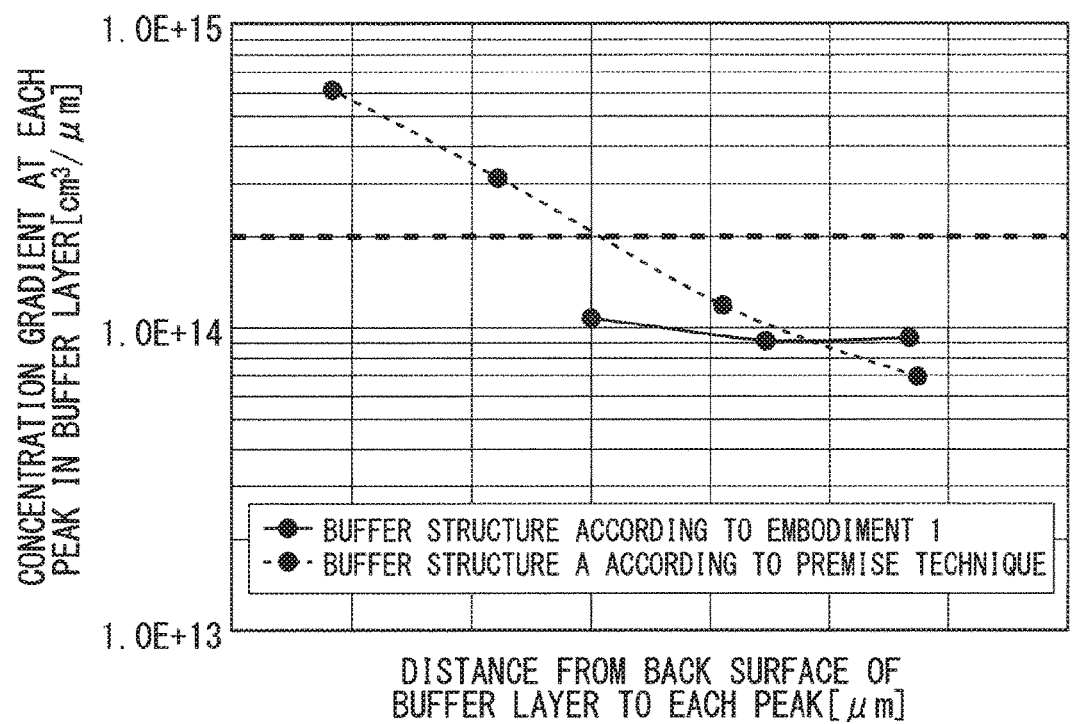
F I G . 4
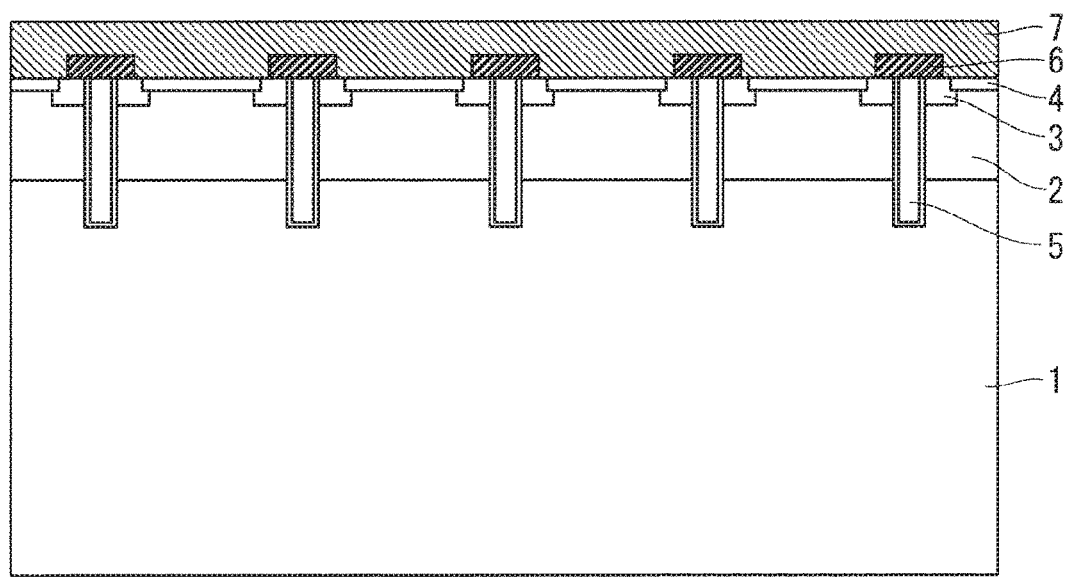

F I G. 5
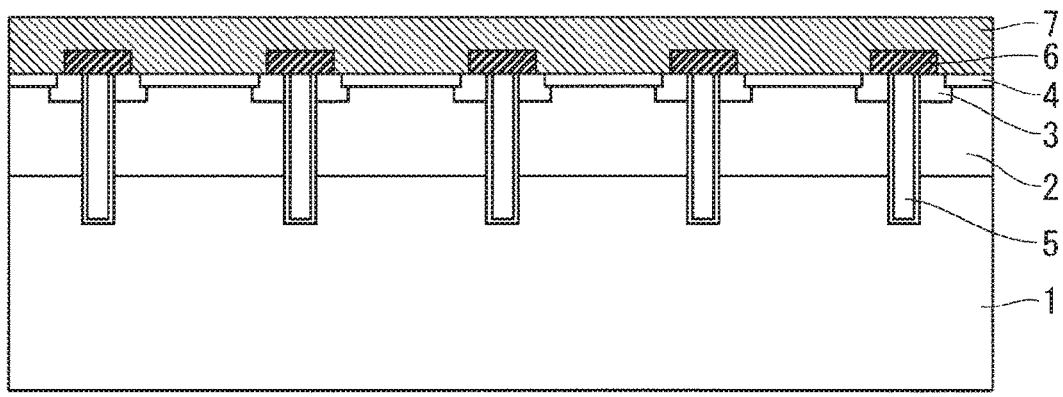
F I G. 6
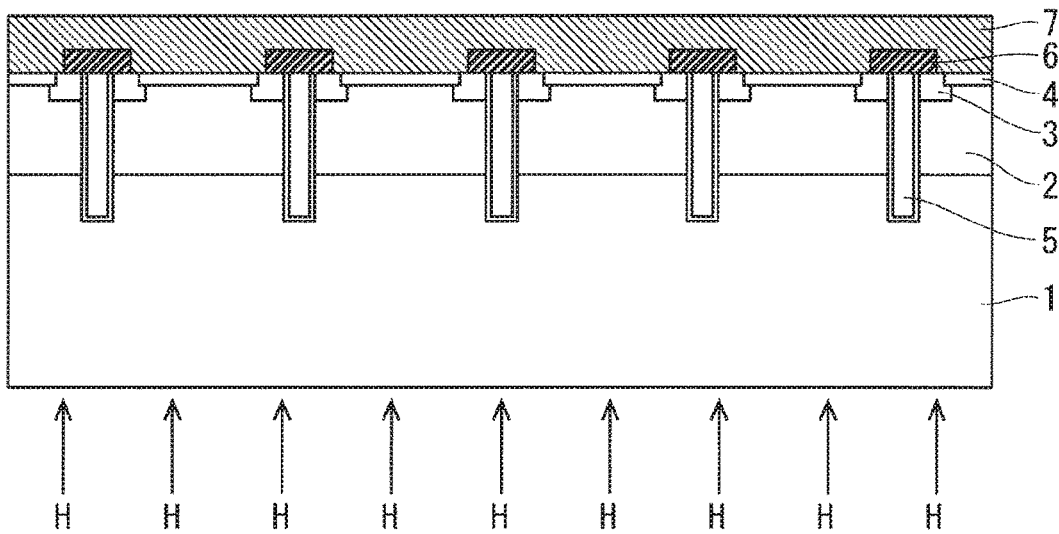

F I G. 7
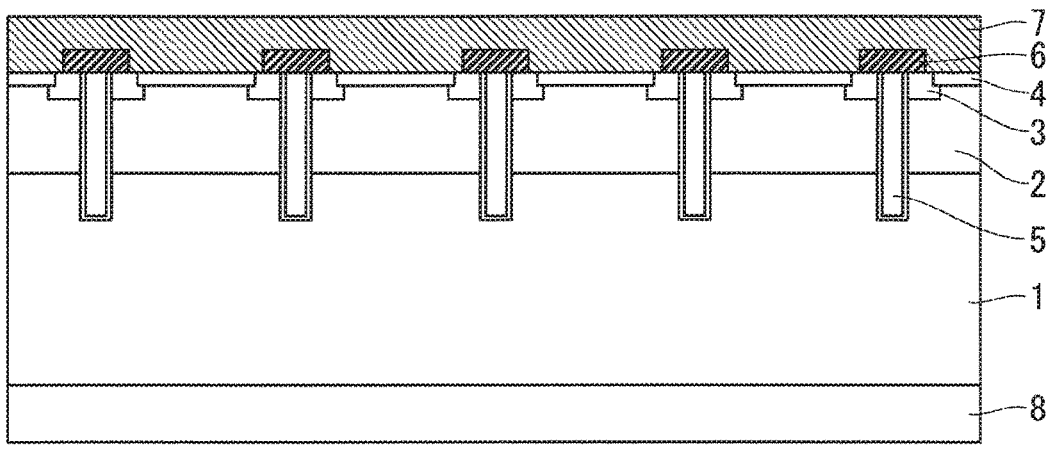
F I G. 8
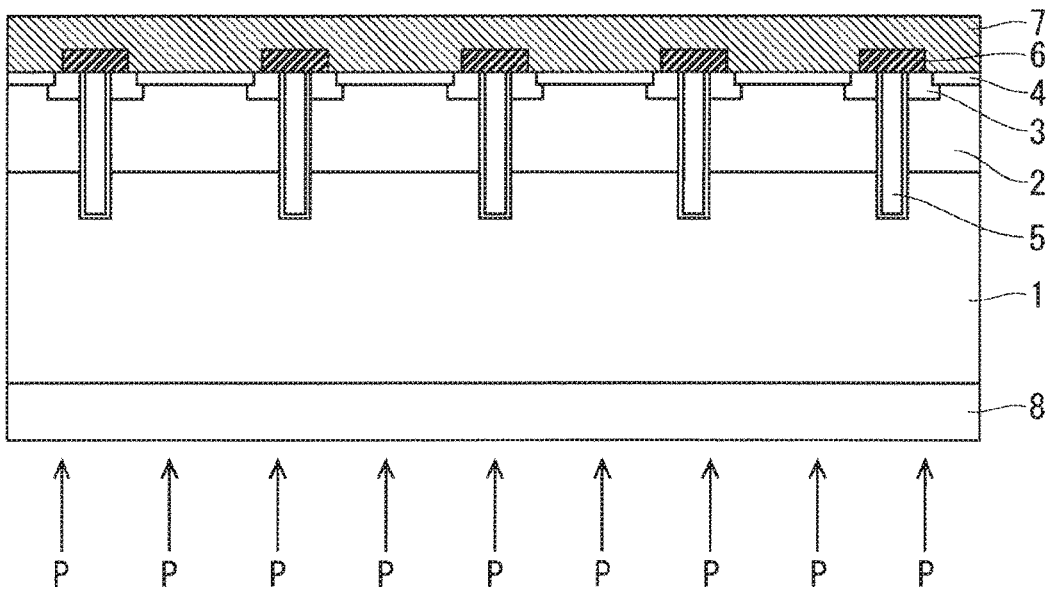

SEMICONDUCTOR DEVICE AND METHOD OF MANUFACTURING THE SAME

BACKGROUND OF THE INVENTION

Field of the Invention

The present invention relates to a semiconductor device such as an insulated gate bipolar transistor (referred to as IGBT hereinafter) or a diode and a method of manufacturing the same.

Description of the Background Art

An IGBT or a diode is used for a power module, for example, for performing a variable speed control of a three-phase motor in a field of general-purpose inverter and AC servo, for example, in terms of energy conservation. The IGBT or the diode requires a device having a low switching loss and on-voltage to reduce inverter loss.

The on-voltage mainly includes a resistance in a thick n type base layer necessary to retain withstand voltage, and it is effective to reduce a thickness of a wafer to reduce the resistance. However, when the thickness of the wafer is reduced, a depletion layer reaches a back surface of the wafer at a time of applying a collector voltage, and a decrease in a withstand voltage or an increase in a leak current occurs. Accordingly, an n+ type buffer layer which is small in depth and has a concentration higher than a substrate concentration is generally formed on a collector side of the IGBT or a cathode side of the diode, using an ion implanter. The substrate concentration herein indicates an impurity concentration contained in the substrate.

However, in accordance with a technical innovation in a manufacturing technique, the thickness of the wafer is increasingly reduced to the extent that the withstand voltage can be ensured, thus in the n+ type buffer layer having a small depth, a surge voltage determined by a source voltage +L*di/dt is applied between a collector-emitter or cathode-anode when the IGBT or the diode performs a switching operation, and when a depletion layer expanding from a surface side reaches a back surface side, a carrier is depleted, thus an oscillation of voltage and current occurs. When the oscillation occurs, radiation noise occurs, thereby having a negative effect on peripheral electronic apparatuses.

In the meanwhile, when an n+ type buffer layer having a low concentration and have a large depth of approximately 30 μm is formed on the back surface side, the depletion layer can be gently stopped even with a large voltage applied to the collector or the cathode at the time of the switching operation. As a result, the carrier at the back surface side is prevented from being depleted and is accumulated, a steep increase in the voltage can be prevented.

It takes 24 hours or longer to form the n+ type buffer layer having the large depth of approximately 30 μm by diffusing phosphorus (P) even by a thermal treatment at a high temperature of 1100° C. or higher, so that mass productivity decreases. Alternatively, there is also a method using accelerator such as a cyclotron or Van de Graaff (for example, refer to Japanese Patent Application Laid-Open No. 2013-138172). For example, in a case where a silicon substrate is irradiated with protons with an acceleration voltage of 8 MeV, a range is approximately 480 μm and a half value width is approximately 20 μm. The proton are not directly implanted into silicon but are implanted into silicon with an absorber in between so as to adjust a position of the range, thus a speed of irradiation energy is reduced, and a peak of protons being broad at a periphery of a surface of silicon can be formed. Subsequently, a thermal treatment is performed at a temperature of 350° C. to 450° C. for one hour to five hours, thereby activating the protons, thus an n type region can be formed. However, a body of the accelerator needs to be surrounded by a concrete shield having a thickness of 1 m to 4 m due to a problem of radiation, so that the accelerator cannot be easily used in a normal semiconductor plant.

Recently, in accordance with an advancement of technical development of the implanter, a buffer layer having a depth of approximately 30 μm can be formed by implanting protons several times using a proton implanter, which is made by converting a general ion implanter (for example, refer to International Publication No. WO 2016/147264).

SUMMARY

Problem to be Solved by the Invention

The buffer layer formed by implanting protons several times has a plurality of peaks of concentration of protons. Such a buffer layer, although having the large depth, has a problem that a concentration distribution at each peak does not have a broad shape. Particularly, since the half value width of the peak is small in a side of low energy in which an acceleration voltage is small at the time of the proton implantation, a concentration gradient of the peak is steep, thus the depletion layer cannot be gently stopped. Specifically, the concentration gradient in the buffer layer is steep, so that the depletion layer extending from the surface sharply stops in the buffer layer on the back surface side at a time of turn-off of the IGBT or recovery of the diode, thereby causing the oscillation of the voltage and current.

An object of the present invention is to provide a semiconductor device capable of preventing an occurrence of oscillation of voltage and current and a method of manufacturing the same.

Means to Solve the Problem

A semiconductor device includes a semiconductor substrate and a first buffer layer being formed in one main surface of the semiconductor substrate and having a plurality of peaks of concentration of protons whose depths from the one main surface are different from each other. In the first buffer layer, a concentration gradient of the protons from one of the plurality of peaks located in a position closer to the one main surface toward another main surface of the semiconductor substrate is smaller than a concentration gradient of the protons from another one of the plurality of peaks located in a position farther away from the one main surface toward the another main surface.

Effects of the Invention

According to the present invention, the semiconductor device includes a semiconductor substrate and a first buffer layer being formed in one main surface of the semiconductor substrate and having a plurality of peaks of concentration of protons whose depths from the one main surface are different from each other, and in the first buffer layer, a concentration gradient of the protons from one of the plurality of peaks located in a position closer to the one main surface toward another main surface of the semiconductor substrate is smaller than a concentration gradient of the protons from another one of the plurality of peaks located in a position farther away from the one main surface toward the another main surface, thus an occurrence of oscillation of voltage and current can be prevented.

These and other objects, features, aspects and advantages of the present invention will become more apparent from the following detailed description of the present invention when taken in conjunction with the accompanying drawings.

BRIEF DESCRIPTION OF THE DRAWINGS

FIG. 3 is a diagram illustrating an example of a concentration gradient in a buffer layer in the semiconductor device according to the embodiment 1 of the present invention.

FIG. 4 is a cross-sectional view illustrating an example of a process of manufacturing the semiconductor device according to the embodiment 1 of the present invention.

FIG. 5 is a cross-sectional view illustrating an example of a process of manufacturing the semiconductor device according to the embodiment 1 of the present invention.

FIG. 6 is a cross-sectional view illustrating an example of a process of manufacturing the semiconductor device according to the embodiment 1 of the present invention.

FIG. 7 is a cross-sectional view illustrating an example of a process of manufacturing the semiconductor device according to the embodiment 1 of the present invention.

FIG. 8 is a cross-sectional view illustrating an example of a process of manufacturing the semiconductor device according to the embodiment 1 of the present invention.

DESCRIPTION OF THE PREFERRED EMBODIMENTS

Embodiments of the present invention are described hereinafter based on the drawings.

<Premise Technique>

A technique as a premise of the present invention is described.

As described above, the IGBT or the diode having the n+ type buffer layer, small in depth, has the problem that the oscillation of the voltage and current occurs. In the meanwhile, the oscillation of the voltage and current can be prevented in the IGBT or the diode having the n+ type buffer layer which is formed by diffusing phosphorus and has the large depth of approximately 30 μm.

Figure 20:
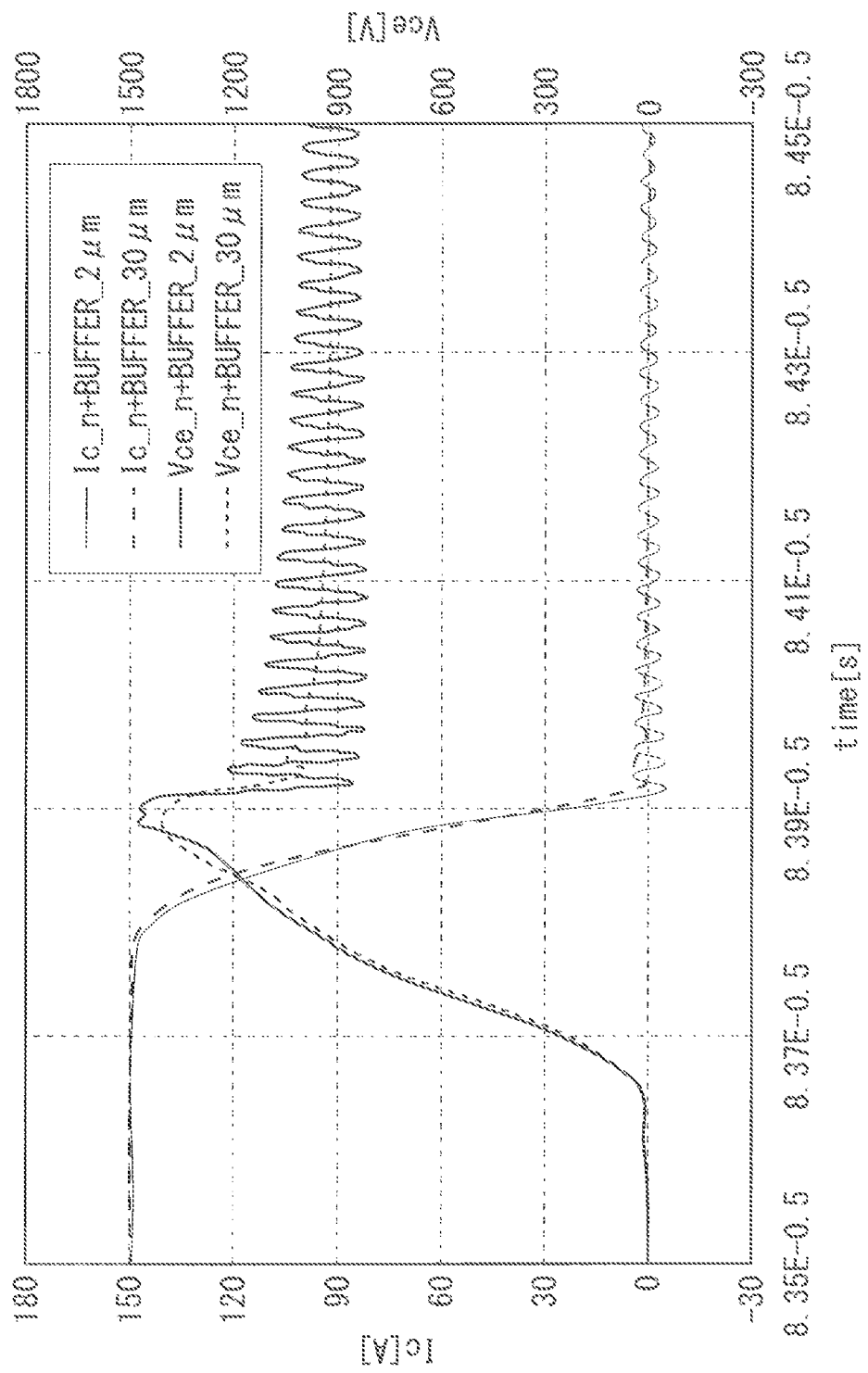
FIG. 20 is a drawing illustrating an example of a turn-off waveform of an L load switching performed in an IGBT of withstand voltage 1200V class using a device simulation.

FIG. 20 is a drawing illustrating a turn-off waveform of an L load switching performed in an IGBT of withstand voltage 1200V class using a device simulation in a case where depths of the n+ type buffer layer formed of phosphorus are 2 μm and 30 μm. A switching condition is Vce=900V and Ic=150 A. As illustrated in FIG. 20, when the depth of the n+ type buffer layer is 2 μm, the oscillation of the waveform occurs, however, when the depth of the n+ type buffer layer is 30 μm, the oscillation of the waveform does not occur.

Figure 21:
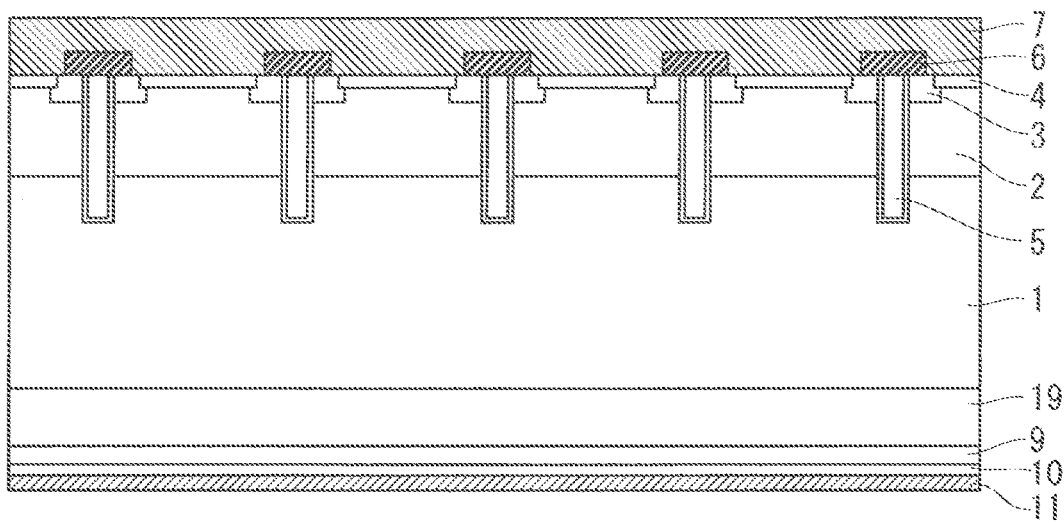
FIG. 21 is a cross-sectional view illustrating an example of a configuration of a semiconductor device according to a premise technique.

FIG. 21 is a cross-sectional view illustrating an example of a configuration of a semiconductor device according to the premise technique. The semiconductor device illustrated in FIG. 21 is an IGBT.

As illustrated in FIG. 21, a p type base layer 2 is formed in a surface of an n type silicon substrate 1 which is a semiconductor substrate. An n+ type emitter layer 3 and a p+ type layer 4 are formed in a surface of the p type base layer 2. A trench gate 5 is formed, via a gate insulating film, in a trench which passes through the p type base layer 2 and the n+ type emitter layer 3. That is to say, the n type silicon substrate 1 includes the p type base layer 2, the n+ type emitter layer 3, the p+ type layer 4, and the trench gate 5.

An interlayer insulating film 6 is formed on the trench gate 5. An emitter electrode 7 is formed to cover the surface of the n type silicon substrate 1 and the interlayer insulating film 6. The emitter electrode 7 is electrically connected to the p+ type layer 4.

A first n type buffer layer 19, a second n type buffer layer 9, and a collector layer 10 are formed in a back surface of the n type silicon substrate 1. That is to say, the n type silicon substrate 1 includes the first n type buffer layer 19, the second n type buffer layer 9, and the collector layer 10. A collector electrode 11 is formed on the collector layer 10. The collector electrode 11 is electrically connected to the collector layer 10. The second n type buffer layer 9 is formed to adjust the supply of holes from the back surface and reduce a leak current. However, the leak current can also be adjusted by optimizing a concentration of the first n type buffer layer 19. Accordingly, the second n type buffer layer 9 needs not necessarily be formed.

Figure 22:
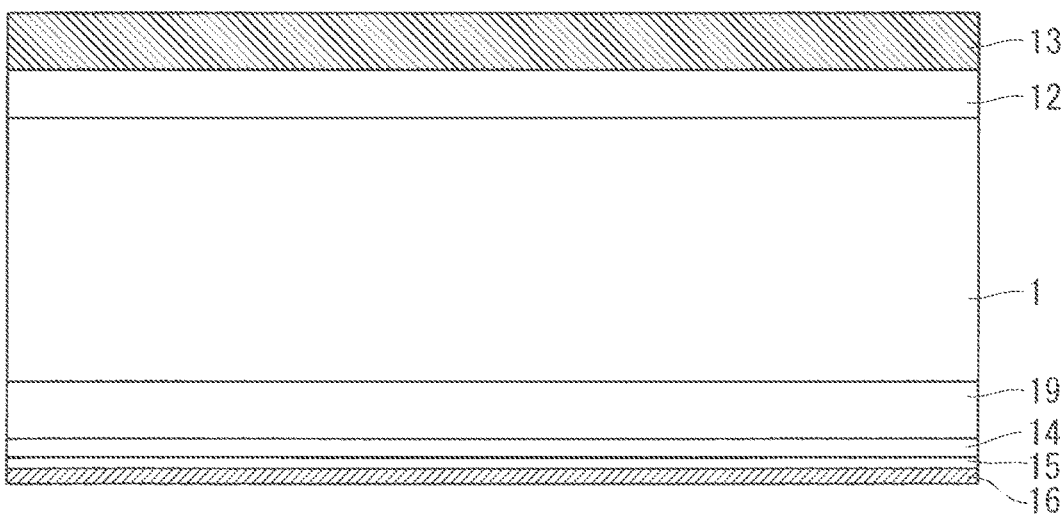
FIG. 22 is a cross-sectional view illustrating an example of a configuration of a semiconductor device according to a premise technique.

FIG. 22 is a cross-sectional view illustrating an example of a configuration of a semiconductor device according to a premise technique. The semiconductor device illustrated in FIG. 22 is a diode.

As illustrated in FIG. 22, a p type anode layer 12 is formed in a surface of the n type silicon substrate 1. That is to say, the n type silicon substrate 1 includes the p type anode layer 12. An anode electrode 13 is formed on the p type anode layer 12. The anode electrode 13 is electrically connected to the p-type anode layer 12.

The first n type buffer layer 19, a third n type buffer layer 14, and a cathode layer 15 are formed in a back surface of the n type silicon substrate 1. That is to say, the n type silicon substrate 1 includes the first n type buffer layer 19, the third n type buffer layer 14, and the cathode layer 15.

A cathode electrode 16 is formed on the cathode layer 15. The cathode electrode 16 is electrically connected to the cathode layer 15. The cathode layer 15 is an n type cathode layer having a high concentration to have an ohmic contact with the cathode electrode 16. However, when the n type of the third n type buffer layer 14 is set to have a high concentration, the third n type buffer layer 14 can double as the cathode layer 15. Accordingly, the cathode layer 15 needs not necessarily be formed.

Figure 23:
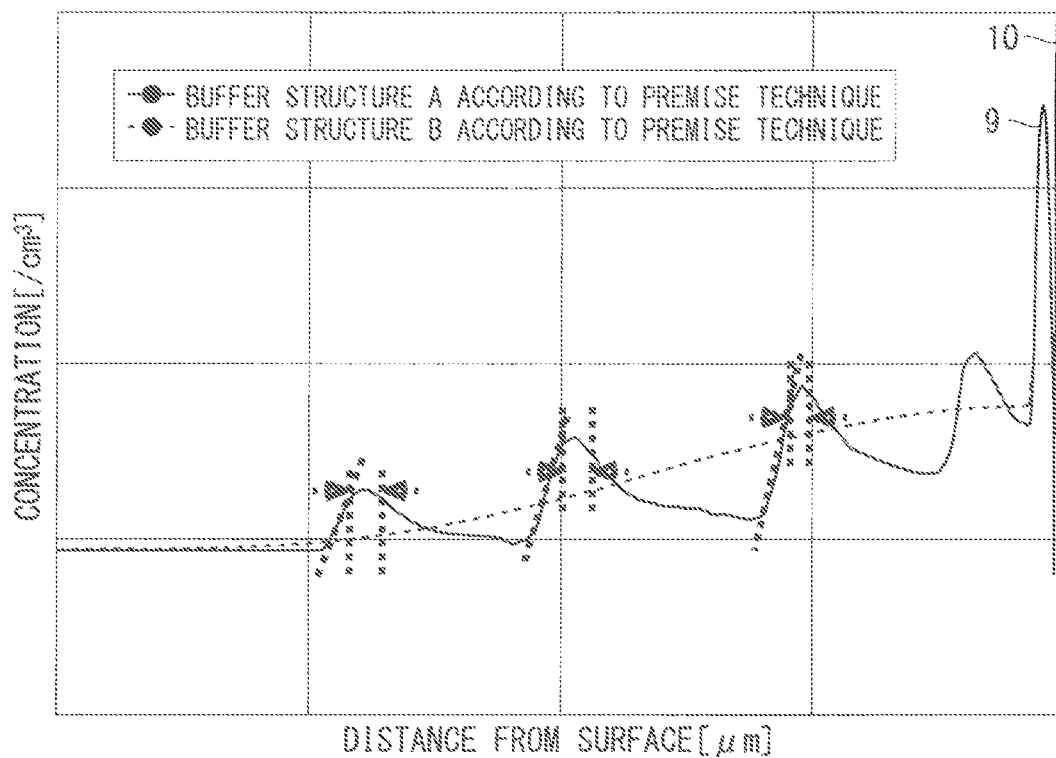
FIG. 23 is a diagram illustrating an example of a concentration distribution of the semiconductor device according to the premise technique.
Figure 24:
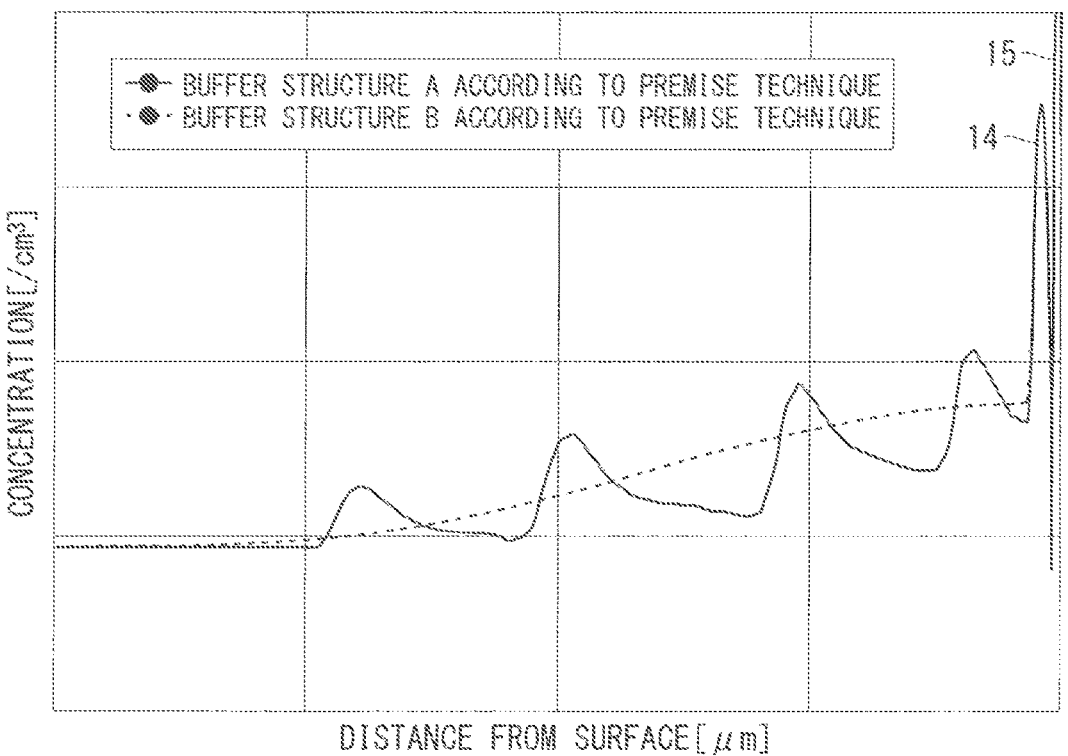
FIG. 24 is a diagram illustrating an example of a concentration distribution of the semiconductor device according to the premise technique.

FIG. 23 is a diagram illustrating an example of a concentration distribution of the semiconductor device illustrated in FIG. 21. FIG. 24 is a diagram illustrating an example of a concentration distribution of the semiconductor device illustrated in FIG. 22.

In FIGS. 23 and 24, a solid line indicates a concentration distribution in a case where the first n type buffer layer 19 is formed by implanting the protons several times. The first n type buffer layer 19 has a structure including three peaks of concentration. Such a structure of the first n type buffer layer 19 formed by implanting the protons several times is referred to as "a buffer structure A" hereinafter. Broken lines being put on the solid line indicate a concentration gradient and a half value width.

In FIGS. 23 and 24, a broken line indicates a concentration distribution in a case where the first n type buffer layer 19 is formed by diffusing phosphorus by performing a thermal treatment for long periods of time or a case where the first n type buffer layer 19 is formed by implanting the protons with an absorber in between with a high acceleration energy of approximately 8 MeV using a cyclotron. Such a structure of the first n type buffer layer 19 formed by diffusing phosphorus by performing the thermal treatment for long periods of time or implanting the protons with the absorber in between with the high acceleration energy of approximately 8 MeV using the cyclotron is referred to as "a buffer structure B" hereinafter.

The buffer layer having a large depth gently stops the extension of the depletion layer when the IGBT or the diode is switched off, thereby being able to preventing the oscillation. Accordingly, the buffer structure B, in which a concentration is low near the surface and gradually increases toward the back surface, is preferable. However, as described above, the buffer structure B has a problem that it has a low mass productivity or cannot be easily used.

In the meanwhile, the buffer structure A has a problem that a concentration distribution at each peak does not have a broad shape. Implanted hydrogen atoms and a crystal defect formed at the time of implanting the protons are necessary to make the protons to serve as donors of n type, and the concentration distribution relatively has a broad shape when the protons are diffused in a region where the protons pass through between the peak and the back surface by the thermal treatment, however, the crystal defect is small in amount in a region between the peak and the surface even though hydrogen increasingly gets off, so that the protons are less diffused and the concentration gradient becomes steep. Particularly, since the half value width of the peak is small in the side of low energy in which the acceleration voltage is small at the time of the proton implantation, the concentration gradient of the peak is steep, thus the depletion layer cannot be gently stopped, and the oscillation of the voltage and current may occur. Accordingly, the concentration gradient is preferably as gentle as possible.

The present invention is made to solve the above problems, and is described in detail hereinafter.

Embodiment 1

<Configuration>

Figure 1:
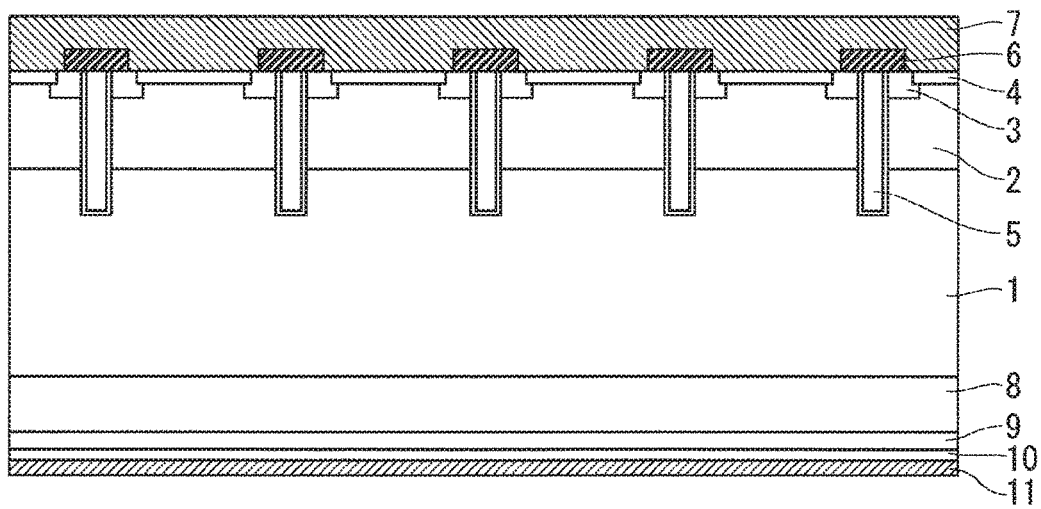
FIG. 1 is a cross-sectional view illustrating an example of a configuration of a semiconductor device according to an embodiment 1 of the present invention.

FIG. 1 is a cross-sectional view illustrating an example of a configuration of a semiconductor device according to the embodiment 1 of the present invention. The semiconductor device illustrated in FIG. 1 is an IGBT. The semiconductor device according to the present embodiment 1 has features in a structure of a first n type buffer layer 8. Since the other configuration of the semiconductor device according to the embodiment 1 is similar to that of the premise technique illustrated in FIG. 21, the detailed description is omitted herein.

Figure 2:
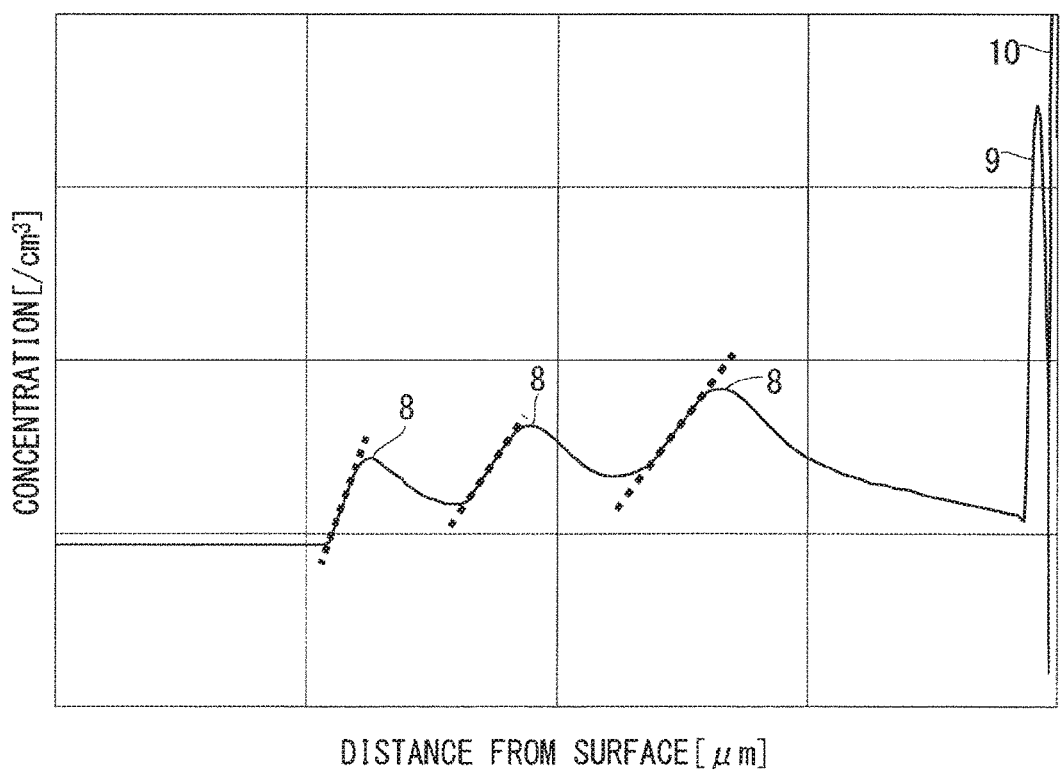
FIG. 2 is a diagram illustrating an example of a concentration distribution of the semiconductor device according to the embodiment 1 of the present invention.

FIG. 2 is a diagram illustrating an example of a concentration distribution of the semiconductor device illustrated in FIG. 1. As illustrated in FIG. 2, the first n type buffer layer 8 has a structure including three peaks of concentration. In the first n type buffer layer 8, a concentration gradient from a peak located in a position closer to a back surface which is one main surface of the n type silicon substrate 1 toward a surface which is the other main surface of the n type silicon substrate 1 is smaller than a concentration gradient of protons from a peak located in a position farther away from the back surface toward the other main surface. Broken lines in FIG. 2 indicate the concentration gradient.

FIG. 3 is a drawing illustrating an example of the concentration gradient at each peak in the first n type buffer layer 8. In FIG. 3, a broken line indicates a concentration gradient at each peak in the buffer structure A according to the premise technique illustrated in FIG. 23. A solid line indicates a concentration gradient at each peak in a buffer structure of the first n type buffer layer 8 according to the present embodiment 1. Each of the concentration gradient is obtained from a slope between a peak position of the concentration and a position where the concentration is smallest in a case where the concentration is reduced from the peak position toward the surface.

As illustrated in FIG. 3, the buffer layer having a large depth is formed by the high acceleration energy in the buffer structure A according to the premise technique, thus the concentration gradient decreases as the depth of the buffer layer increases. In the meanwhile, the concentration gradient is totally gentle in the buffer structure of the first n type buffer layer 8 according to the present embodiment 1, and the concentration gradient does not change even in the deep position. The concentration gradient is equal to or smaller than $2.0E14$ $cm^3/\mu m$ in whole.

In order to reduce the oscillation of the voltage and current, it is preferable that the concentration at each peak in the first n type buffer layer 8 reduces with the increasing distance from the back surface, and it is also preferable that the depth of the first n type buffer layer 8 is equal to or larger than 20 μm.

<Method of Manufacturing IGBT>

FIGS. 4 to 11 are drawings each illustrating an example of a process of manufacturing the IGBT which is the semiconductor device according to the present embodiment 1.

As illustrated in FIG. 4, a surface structure of the IGBT is formed on a side of the surface of the n type silicon substrate 1 by a normal surface process. FIG. 4 indicates a state where the surface process in the IGBT is completed, and a wafer has a thickness of approximately 700 μm which is substantially the same as that of a bare wafer. Next, as illustrated in FIG. 5, a side of the back surface of the n type silicon substrate 1 is polished to have a desired thickness by a grinder or a wet etching. The back surface of the n type silicon substrate 1 in the above state is referred to as one main surface of the n type silicon substrate 1. The main surface of the n type silicon substrate 1 opposite to the one main surface is referred to as the other main surface of the n type silicon substrate 1.

Next, as illustrated in FIG. 6, the protons are implanted into the back surface of the n type silicon substrate 1 several times at different acceleration voltages being 1500 keV at a maximum, using a general ion implanter. A range of the protons is approximately 6 μm at 500 keV and 30 μm at 1500 keV. When an implantation angle is increased at the time of implanting the protons, the depth of the buffer layer can be reduced, the half value width can be increased, and the concentration gradient can be reduced. For example, when the protons are implanted with the acceleration voltage of 1500 keV and at the implantation angle of 60°, an implantation depth of the protons is 15 μm, which is half of 30 μm, because cos 60° with respect to the implantation angle of 0°=0.5, thus the buffer layer having the gentle concentration gradient can be formed. As described above, when the acceleration voltage and the implantation angle at the time of implanting the protons are adjusted, the buffer layer having the gentle concentration gradient, such as the buffer layer formed by diffusing phosphorus or the buffer layer formed by implanting the protons using the cyclotron, can also be formed by implanting the protons using the general ion implanter. In the present embodiment 1, the first n type buffer layer 8 having the concentration distribution as illustrated in FIG. 2 is formed by adjusting the acceleration voltage and the implantation angle at the time of implanting the protons.

As the other method of controlling the range of the protons and the half value width, there is a method of implanting ions into the back surface of the n type silicon substrate 1 several times with a resist or a shield such as a metal mask which serves as the absorber in between, for example, with different acceleration voltages of 1.5 MeV or smaller using the ion implanter. According to the above method, the range of the protons can be adjusted, and the buffer layer having the large half value width as one formed in a region with the small depth in the side of the back surface of the n type silicon substrate 1 with the high acceleration voltage can be formed.

Figure 9:
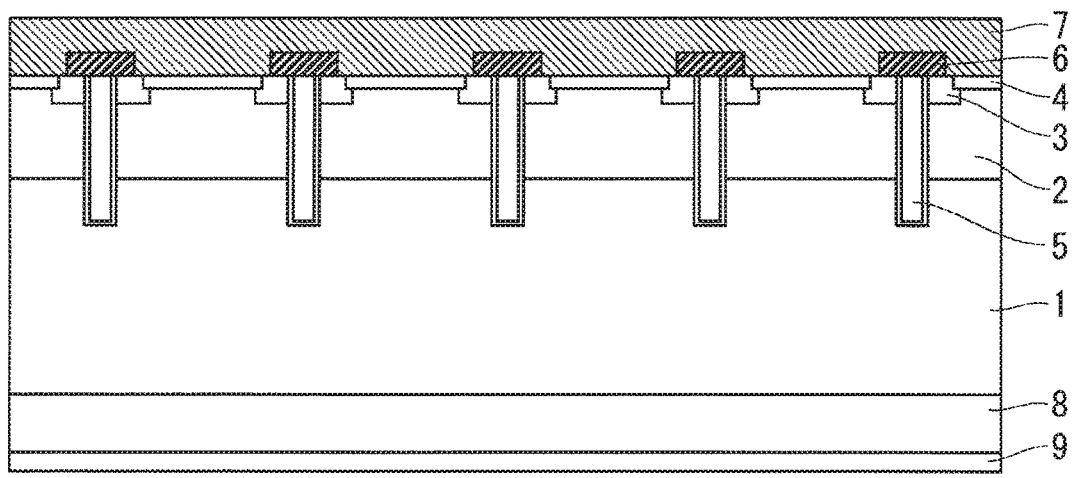
FIG. 9 is a cross-sectional view illustrating an example of a process of manufacturing the semiconductor device according to the embodiment 1 of the present invention.

Next, as illustrated in FIG. 7, the protons are activated by a furnace annealing at a temperature of approximately 350° C. to 450° C. to form the first n type buffer layer 8. Next, as illustrated in FIG. 8, phosphorus is implanted into the region with the small depth in the side of the back surface of the n type silicon substrate 1 with the acceleration voltage of 1 MeV or smaller. Although FIG. 8 illustrates the case of implanting phosphorus as an impurity, arsenic (As) may also be used instead of phosphorus. Next, as illustrated in FIG. 9, phosphorus is activated by a laser annealing to form the second n type buffer layer 9. The increase in the leak current can be prevented by forming the second n type buffer layer 9.

Figure 10:
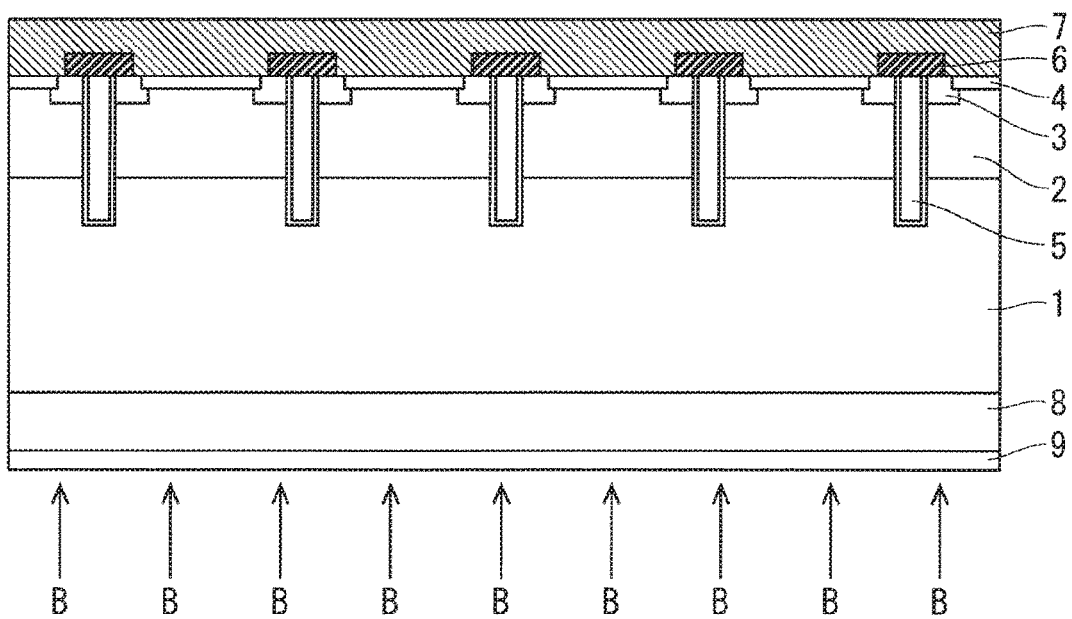
FIG. 10 is a cross-sectional view illustrating an example of a process of manufacturing the semiconductor device according to the embodiment 1 of the present invention.
Figure 11:
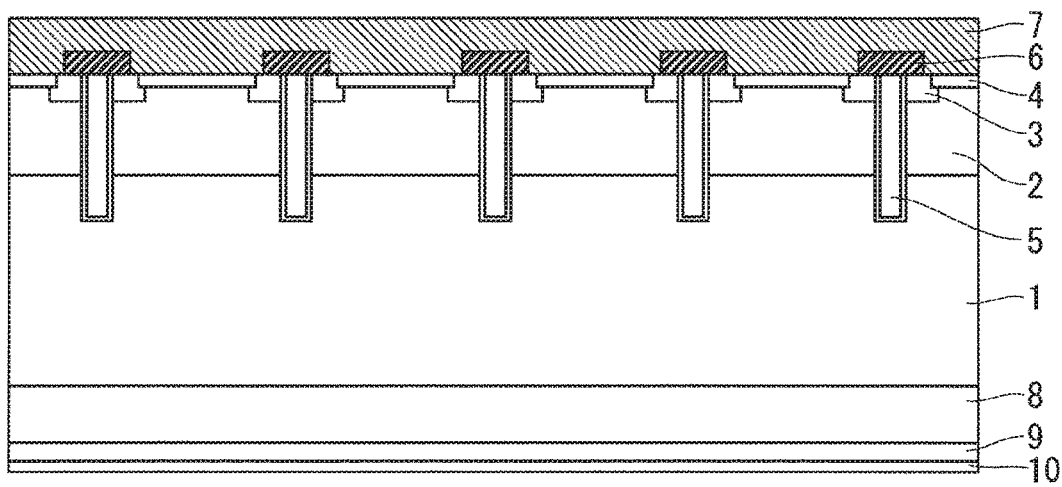
FIG. 11 is a cross-sectional view illustrating an example of a process of manufacturing the semiconductor device according to the embodiment 1 of the present invention.

Next, as illustrated in FIG. 10, boron (B) is implanted into the back surface of then type silicon substrate 1. Next, as illustrated in FIG. 11, boron is activated by a laser annealing to form the collector layer 10.

An order of performing each processing of implanting the proton, the furnace annealing, implanting phosphorus and boron, and the laser annealing described above is not limited thereto as long as the annealing is performed after the implantation, but a method convenient in manufacturing may be selected.

Subsequently, the collector electrode 11 made of Al/Ti/Ni/Au or AlSi/Ti/Ni/Au is formed on the back surface of the n type silicon substrate 1 by sputtering. Finally, a thermal treatment is performed to reduce a contact resistance between the n type silicon substrate 1 and the collector electrode 11. At this time, the thermal treatment may double as activation of the protons. In the above case, there is no need to perform the thermal treatment for activating the protons described above. The IGBT illustrated in FIG. 1 is completed through each process described above.

As described above, according to the present embodiment 1, as illustrated in FIG. 2, the first n type buffer layer 8 has the buffer structure that the concentration gradient from the peak located in the position closer to the back surface which is one main surface of the n type silicon substrate 1 toward the surface which is the other main surface of the n type silicon substrate 1 is smaller than the concentration gradient of the protons from the peak located in the position farther away from the back surface toward the other main surface. Accordingly, the spread of the depletion layer at the time of turn-off of the IGBT is reduced, thus the oscillation of the voltage and current can be prevented. That is to say, the oscillation capacity at the time of turn-off of the IGBT can be enhanced. Since the half value width in the peak of the concentration of the protons implanted by the ion implanter is small, the first n type buffer layer 8 totally having the broad concentration distribution can be formed by providing the three or more peaks of concentration in the first n type buffer layer 8.

Figure 12:
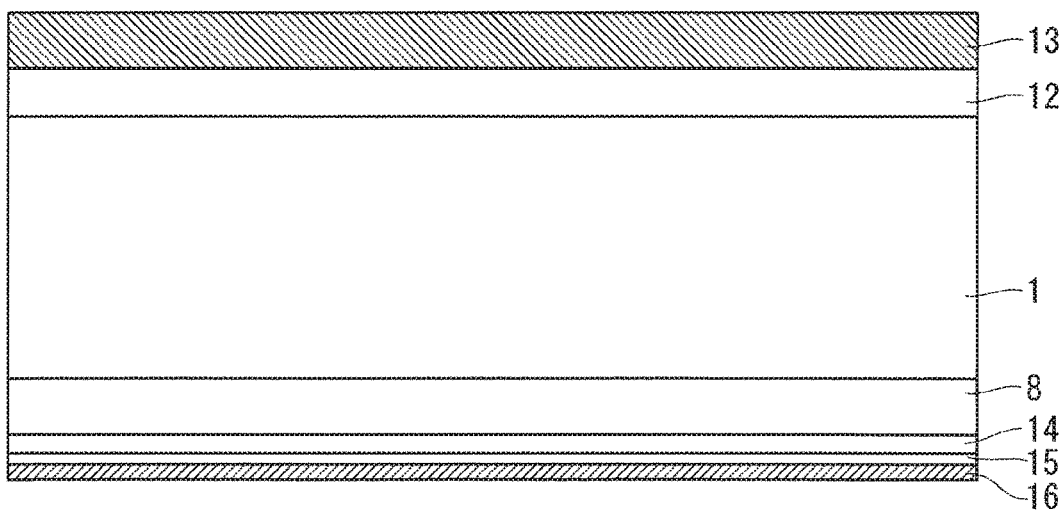
FIG. 12 is a cross-sectional view illustrating an example of the configuration of the semiconductor device according to the embodiment 1 of the present invention.

Although the IGBT is described above, when the buffer layer of the diode also has the configuration similar to that of the IGBT, the effect similar to that in the IGBT can be obtained. FIG. 12 is a cross-sectional view illustrating an example of a configuration of the diode according to the present embodiment 1. The diode according to the present embodiment 1 has features in the structure of the first n type buffer layer 8. The other configuration is similar to that of the diode according to the premise technique illustrated in FIG. 22.

The structure of the first n type buffer layer 8 in the diode is similar to that of the first n type buffer layer 8 in the IGBT described above. That is to say, the first n type buffer layer 8 in the diode has a buffer structure as illustrated in FIG. 2. A method of manufacturing the diode is similar to that of manufacturing the IGBT described above, the collector layer 10 of the IGBT corresponds to the third n type buffer layer or the cathode layer 15 of the diode, and the collector electrode 11 of the IGBT corresponds to the cathode electrode 16 of the diode. Such a configuration reduces the spread of the depletion layer at the time of recovery of the diode, thereby being able to prevent the oscillation of the voltage and current. That is to say, the oscillation capacity at the time of recovery of the diode can be enhanced.

Embodiment 2

Figure 13:
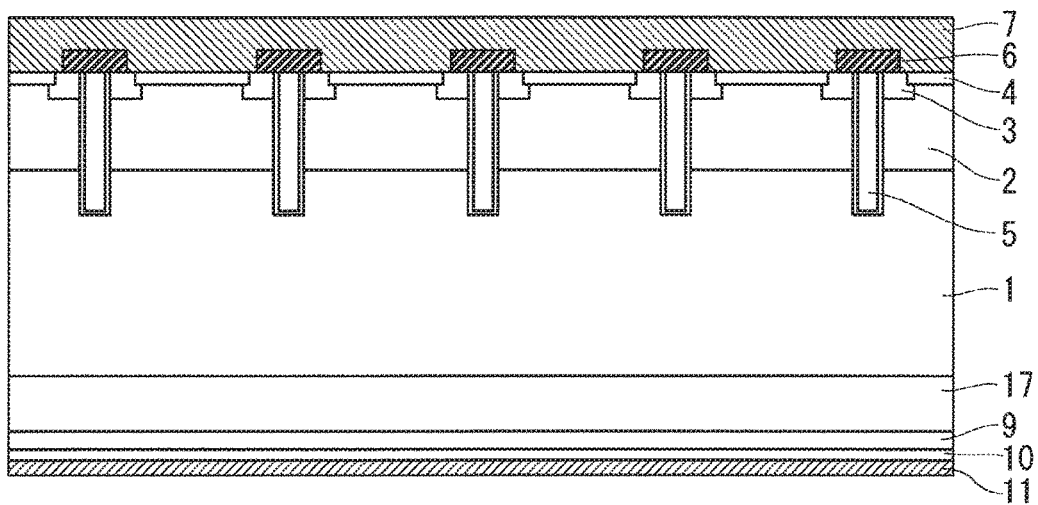
FIG. 13 is a cross-sectional view illustrating an example of a configuration of a semiconductor device according to an embodiment 2 of the present invention.

FIG. 13 is a cross-sectional view illustrating an example of a configuration of a semiconductor device according to the embodiment 2 of the present invention. The semiconductor device illustrated in FIG. 13 is an IGBT. The semiconductor device according to the present embodiment 2 has features in a structure of a first n type buffer layer 17. Since the other configuration and manufacturing method are similar to those of the embodiment 1, the detailed description is omitted herein.

Figure 14:
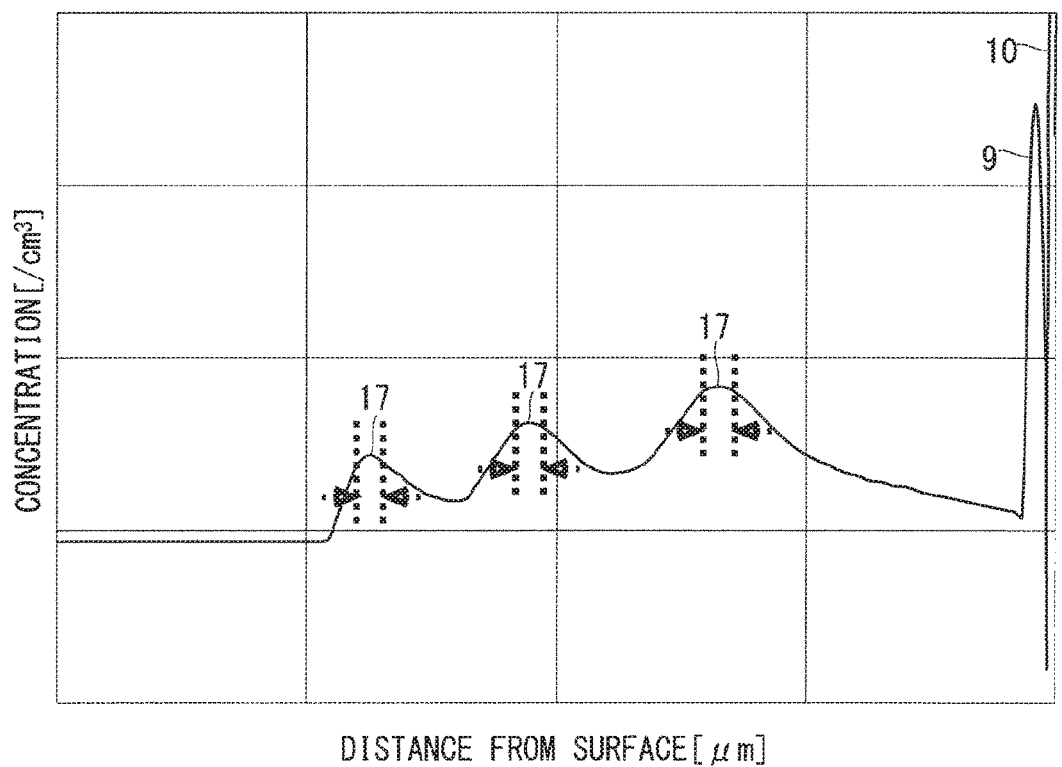
FIG. 14 is a diagram illustrating an example of a concentration distribution of the semiconductor device according to the embodiment 2 of the present invention.

FIG. 14 is a diagram illustrating an example of a concentration distribution of the semiconductor device illustrated in FIG. 13. As illustrated in FIG. 14, the first n type buffer layer 17 has a structure including three peaks of concentration. In the first n type buffer layer 17, a half value width of a peak located in a position closer to the back surface which is the one main surface of the n type silicon substrate 1 is larger than a half value width of a peak located farther away from the back surface. Each of broken lines in FIG. 4 indicates the half value width.

Figure 15:
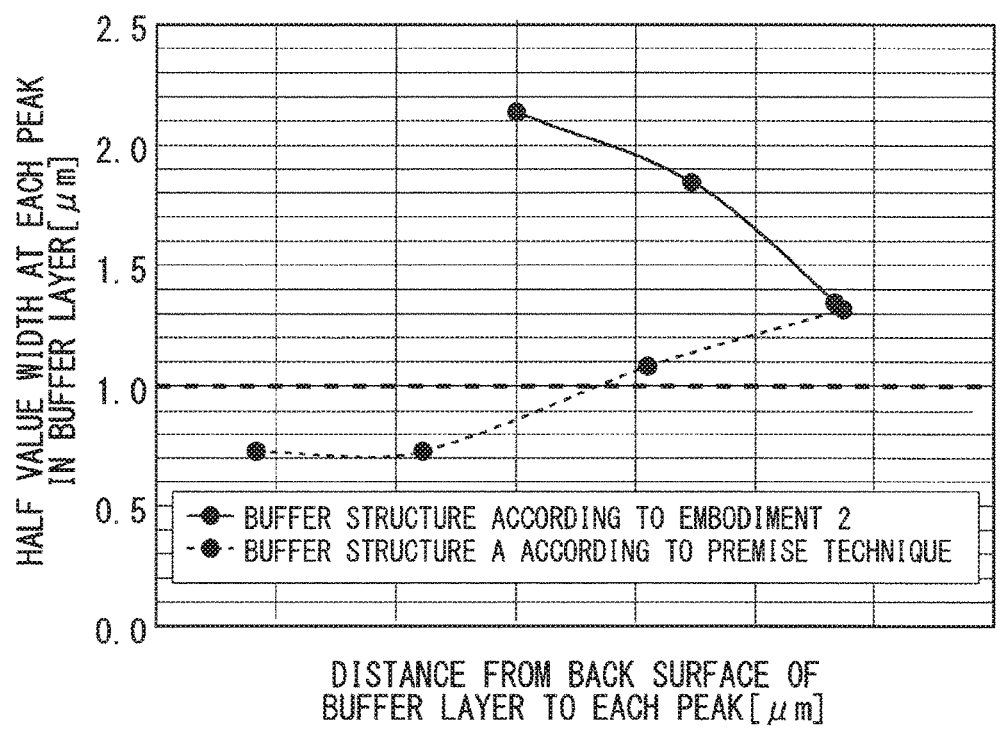
FIG. 15 is a diagram illustrating an example of a half value width in a buffer layer in the semiconductor device according to the embodiment 2 of the present invention.

FIG. 15 is a drawing illustrating an example of the half value width at each peak in the first n type buffer layer 17. In FIG. 15, a broken line indicates a half value width at each peak in the buffer structure A according to the premise technique illustrated in FIG. 23. A solid line indicates a half value width at each peak in a buffer structure of the first n type buffer layer 17 according to the present embodiment 2.

As illustrated in FIG. 15, the buffer layer having a large depth is formed by the high acceleration energy in the buffer structure A according to the premise technique, thus the half value width increases as the depth of the buffer layer increases. In the meanwhile, in the buffer structure of the first n type buffer layer 17 according to the present embodiment 2, the half value width does not increase even in a deep position in the first n type buffer layer 17. The half value width at each peak is fully equal to or larger than 1.0 μm.

As described above, according to the present embodiment 2, as illustrated in FIG. 14, the first n type buffer layer 17 has the buffer structure that the half value width of the peak located in the position closer to the back surface which is the one main surface of the n type silicon substrate 1 is larger than the half value width of the peak located farther away from the back surface. Accordingly, the spread of the depletion layer at the time of turn-off of the IGBT is reduced, thus the oscillation of the voltage and current can be prevented. That is to say, the oscillation capacity at the time of turn-off of the IGBT can be enhanced.

Figure 16:
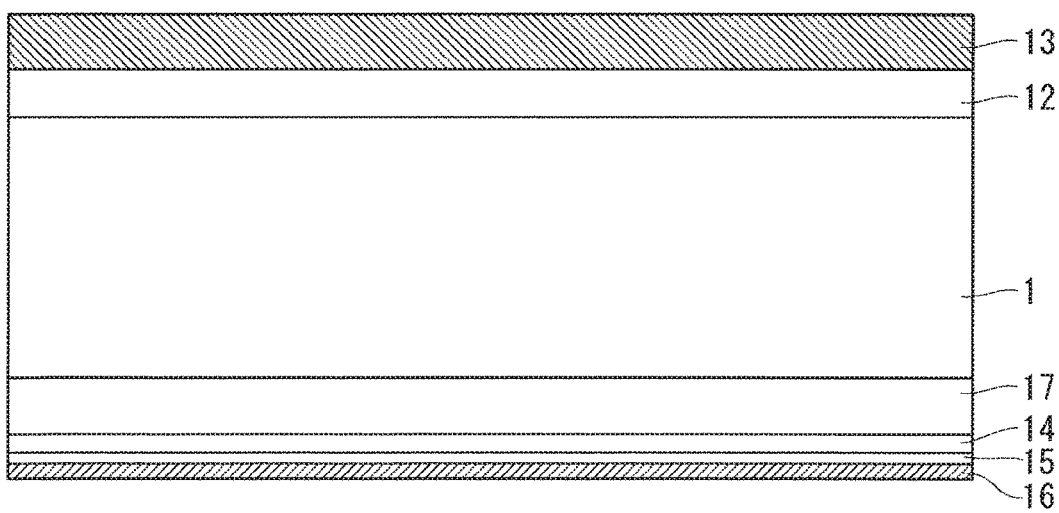
FIG. 16 is a cross-sectional view illustrating an example of the configuration of the semiconductor device according to the embodiment 2 of the present invention.

Although the IGBT is described above, when the buffer layer of the diode also has the configuration similar to that of the IGBT, the effect similar to that in the IGBT can be obtained. FIG. 16 is a cross-sectional view illustrating an example of a configuration of the diode according to the present embodiment 2. The diode according to the present embodiment 2 has features in the structure of the first n type buffer layer 17. The other configuration and manufacturing method are similar to those of the diode according to the embodiment 1.

The structure of the first n type buffer layer 17 in the diode is similar to that of the first n type buffer layer 17 in the IGBT described above. That is to say, the first n type buffer layer 17 in the diode has a buffer structure as illustrated in FIG. 14. Such a configuration reduces the spread of the depletion layer at the time of recovery of the diode, thereby being able to prevent the oscillation of the voltage and current. That is to say, the oscillation capacity at the time of recovery of the diode can be enhanced.

Embodiment 3

Figure 17:
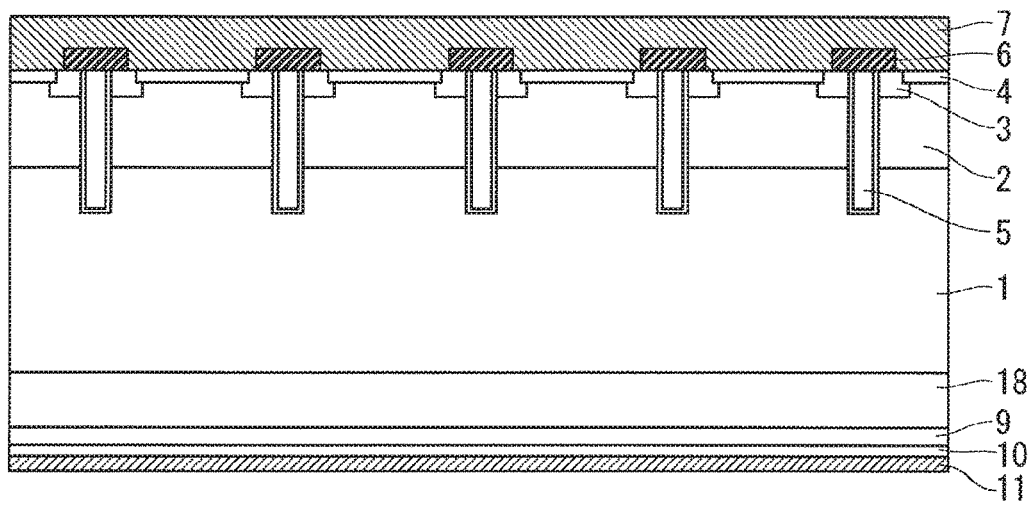
FIG. 17 is a cross-sectional view illustrating an example of a configuration of a semiconductor device according to an embodiment 3 of the present invention.

FIG. 17 is a cross-sectional view illustrating an example of a configuration of a semiconductor device according to the embodiment 3 of the present invention. The semiconductor device illustrated in FIG. 17 is an IGBT. The semiconductor device according to the present embodiment 3 has features in a structure of a first n type buffer layer 18. Since the other configuration and manufacturing method are similar to those of the embodiment 1 or the embodiment 2, the detailed description is omitted herein.

Figure 18:
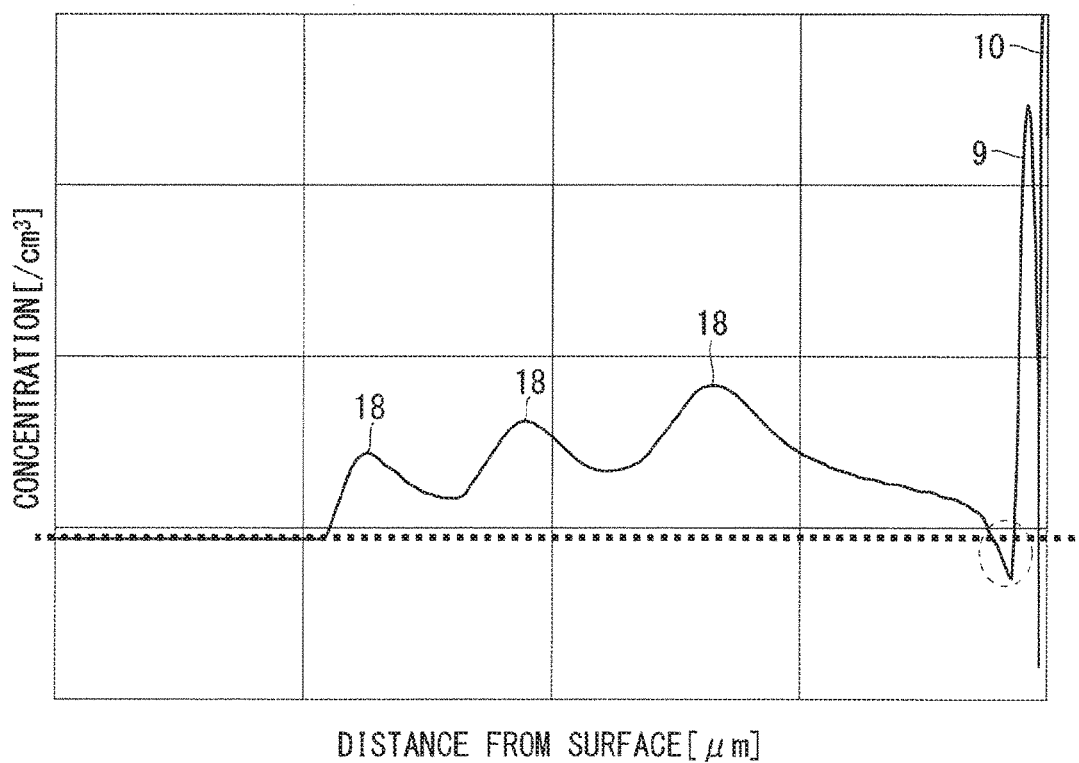
FIG. 18 is a diagram illustrating an example of a concentration distribution of the semiconductor device according to the embodiment 3 of the present invention.

FIG. 18 is a diagram illustrating an example of a concentration distribution of the semiconductor device illustrated in FIG. 17. The thermal treatment at a temperature of approximately 350° C. to 450° C. is performed on the protons, then the protons are diffused and serve as donors. However, in a case where the thermal treatment is insufficiently performed, the protons are not diffused to an outermost surface of the back surface of the n type silicon substrate 1 but the crystal defect remains. As illustrated in FIG. 18, when there is a region which has a concentration equal to or smaller than that of the n type silicon substrate 1 in spreading resistance (SR) profile, the crystal defect is considered to remain in the region. Although the crystal defect has a demerit such as an increase in leak current, when it appropriately remains, the IGBT with a high speed specification having a high on-voltage and a low turn-off loss can be achieved.

As described above, according to the present embodiment 3, when the first n type buffer layer 18 has the structure including the crystal defect as illustrated in FIG. 18, the IGBT with the high speed specification having the high on-voltage and the low turn-off loss can be achieved in addition to the effect of the embodiment 1 or the embodiment 2.

Figure 19:
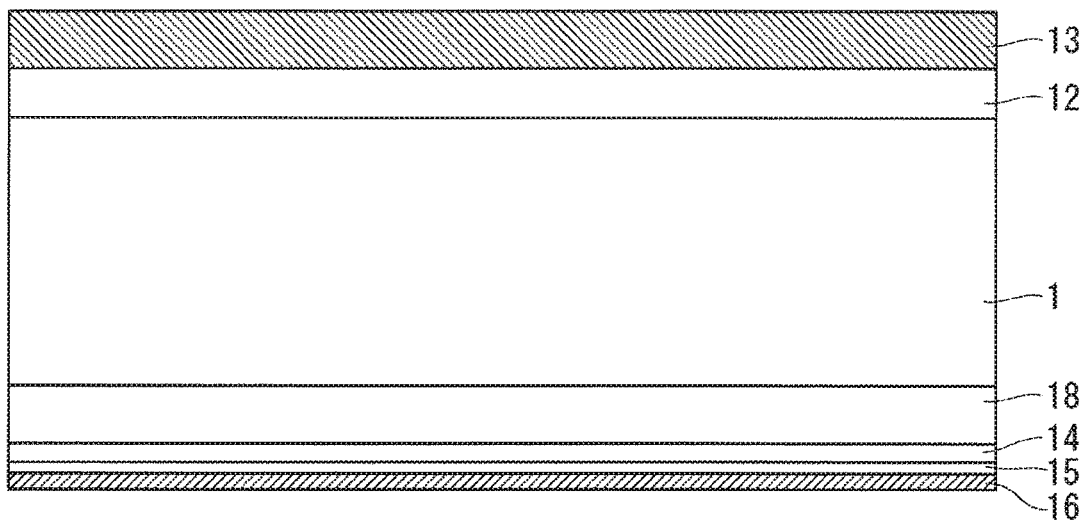
FIG. 19 is a cross-sectional view illustrating an example of the configuration of the semiconductor device according to the embodiment 3 of the present invention.

Although the IGBT is described above, when the buffer layer of the diode also has the configuration similar to that of the IGBT, the effect similar to that in the IGBT can be obtained. FIG. 19 is a cross-sectional view illustrating an example of a configuration of the diode according to the present embodiment 3. The diode according to the present embodiment 3 has features in the structure of the first n type buffer layer 18. The other configuration and manufacturing method are similar to those of the diode according to the embodiment 1 or the embodiment 2.

The structure of the first n type buffer layer 18 in the diode is similar to that of the first n type buffer layer 18 in the IGBT described above. That is to say, the first n type buffer layer 18 in the diode has a buffer structure as illustrated in FIG. 18. According to such a configuration, the diode with the high speed specification having the reduced recovery loss can be achieved in addition to the effect of the embodiment 1 or the embodiment 2.

According to the present invention, the above embodiments can be arbitrarily combined, or each embodiment can be appropriately varied or omitted within the scope of the invention.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device, comprising:
a semiconductor substrate; and
a first buffer layer being formed in one main surface at one side of the semiconductor substrate which is closer to the first buffer layer than another main surface at an opposite side of the semiconductor substrate and having a plurality of peaks of concentration of protons whose depths from the one main surface are different from each other, wherein
in the first buffer layer, a concentration gradient of the protons from one of the plurality of peaks located in a position closer to the one main surface toward the another main surface of the semiconductor substrate is smaller than a concentration gradient of the protons from another one of the plurality of peaks located in a position farther away from the one main surface toward the another main surface.

2. The semiconductor device according to claim 1, wherein
each of the concentration gradients of the protons from each of the plurality of peaks toward the another main surface is equal to or smaller than $2.0E14$ cm$^3$/μm.

3. The semiconductor device according to claim 1, wherein
in the first buffer layer, the concentration of the protons in a region located closer to the one main surface than the another main surface is equal to or smaller than an impurity concentration of the semiconductor substrate.

4. The semiconductor device according to claim 1, wherein
in the first buffer layer, each of the plurality of peaks of the concentration of the protons becomes smaller from the one main surface toward the another main surface of the semiconductor substrate.

5. The semiconductor device according to claim 1, wherein
the first buffer layer includes three or more peaks of the concentration of the protons.

6. The semiconductor device according to claim 1, wherein
the first buffer layer has a depth equal to or larger than 20 μm from the one main surface.

7. The semiconductor device according to claim 1, further comprising
a second buffer layer formed in the one main surface at the one side of the semiconductor substrate.

8. The semiconductor device according to claim 7, wherein
an impurity of the second buffer layer is made of phosphorus or arsenic.

9. A method of manufacturing the semiconductor device according to claim 8, wherein
the first buffer layer is formed by activating the protons by a furnace annealing, and
the second buffer layer is formed by activating the phosphorus or the arsenic by a laser annealing.

10. The semiconductor device according to claim 1, wherein
the semiconductor device is an insulated gate bipolar transistor or a diode.

11. A method of manufacturing the semiconductor device according to claim 1, wherein
the first buffer layer is formed by implanting ions several times, using an ion implanter, with different acceleration voltages of 1.5 MeV or smaller at different implantation angles.

12. A method of manufacturing the semiconductor device according to claim 1, wherein
the first buffer layer is formed by implanting ions several times, using an ion implanter, with a shield which shields a region where the first buffer layer is to be formed in the one main surface of the semiconductor substrate in between with different acceleration voltages of 1.5 MeV or smaller.

13. A semiconductor device, comprising:
a semiconductor substrate; and
a first buffer layer being formed in one main surface at one side of the semiconductor substrate which is closer to the first buffer layer than another main surface at an opposite side of the semiconductor substrate and having a plurality of peaks of concentration of protons whose depths from the one main surface are different from each other, wherein
in the first buffer layer, a half value width of one of the plurality of peaks located in a position closer to the one main surface is larger than a half value width of another one of the plurality of peaks located in a position farther away from the one main surface.

14. The semiconductor device according to claim 13, wherein
each of the half value widths of each of the plurality of peaks is equal to or larger than 1.0 μM.

15. The semiconductor device according to claim 13, wherein
in the first buffer layer, a concentration of the protons in a region located closer to the one main surface than the another main surface is equal to or smaller than an impurity concentration of the semiconductor substrate.

16. The semiconductor device according to claim 13, wherein
in the first buffer layer, each of the plurality of peaks of the concentration of the protons becomes smaller from the one main surface toward the another main surface of the semiconductor substrate.

17. The semiconductor device according to claim 13, wherein
the first buffer layer includes three or more peaks of the concentration of the protons.

18. The semiconductor device according to claim 13, wherein
the first buffer layer has a depth equal to or larger than 20 μm from the one main surface.

19. The semiconductor device according to claim 13 further comprising
a second buffer layer formed in the one main surface at the one side of the semiconductor substrate.

20. The semiconductor device according to claim 19, wherein
an impurity of the second buffer layer is made of phosphorus or arsenic.

21. A method of manufacturing the semiconductor device according to claim 20, wherein
the first buffer layer is formed by activating the protons by a furnace annealing, and
the second buffer layer is formed by activating the phosphorus or the arsenic by a laser annealing.

22. The semiconductor device according to claim 13, wherein
the semiconductor device is an insulated gate bipolar transistor or a diode.

23. A method of manufacturing the semiconductor device according to claim 13, wherein the first buffer layer is formed by implanting ions several times, using an ion implanter, with different acceleration voltages of 1.5 MeV or smaller at different implantation angles.

24. A method of manufacturing the semiconductor device according to claim 13, wherein
the first buffer layer is formed by implanting ions several times, using an ion implanter, with a shield which shields a region where the first buffer layer is to be formed in the one main surface of the semiconductor substrate in between with different acceleration voltages of 1.5 MeV or smaller.

* * * * *